United States Patent
Li et al.

(10) Patent No.: US 9,261,744 B2
(45) Date of Patent: Feb. 16, 2016

(54) ARRAY SUBSTRATE, FABRICATING METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Tiansheng Li, Beijing (CN); Zhenyu Xie, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/439,948
(22) PCT Filed: Aug. 26, 2014
(86) PCT No.: PCT/CN2014/085203
§ 371 (c)(1),
(2) Date: Apr. 30, 2015
(87) PCT Pub. No.: WO2015/051677
PCT Pub. Date: Apr. 16, 2015

(65) Prior Publication Data
US 2015/0293396 A1 Oct. 15, 2015

(30) Foreign Application Priority Data
Oct. 12, 2013 (CN) .......................... 2013 1 0476473

(51) Int. Cl.
*H01L 27/14* (2006.01)
*G02F 1/1345* (2006.01)
(Continued)

(52) U.S. Cl.
CPC .......... *G02F 1/13454* (2013.01); *G02F 1/1362* (2013.01); *G02F 1/1368* (2013.01);
(Continued)

(58) Field of Classification Search
CPC ................ H01L 29/423; H01L 29/786; H01L 29/41733; H01L 29/66765; H01L 29/78618; H01L 29/78669; H01L 27/1248; H01L 27/1222; H01L 27/1214; H01L 27/1288; H01L 27/127; H01L 21/32139; H01L 21/308; H01L 21/31144; H01L 21/77
USPC ............................................ 257/72; 438/158
See application file for complete search history.

(56) References Cited

U.S. PATENT DOCUMENTS

| 8,193,534 B2* | 6/2012 | Zhang | G02F 1/133512 257/57 |
| 2008/0023697 A1* | 1/2008 | Cho | H01L 51/0545 257/40 |

(Continued)

FOREIGN PATENT DOCUMENTS

| CN | 102646713 A | 8/2012 |
| CN | 203561812 U | 4/2014 |

(Continued)

OTHER PUBLICATIONS

Nov. 25, 2014—(WO) International Search Report—App PCT/CN2012/085203—Eng Tran.

*Primary Examiner* — Trung Q Dang
(74) *Attorney, Agent, or Firm* — Banner & Witcoff, Ltd.

(57) ABSTRACT

The present invention discloses an array substrate, a fabricating method of thereof and a display device. The array substrate comprises a base substrate, and a pattern of a gate, a pattern of a gate insulating layer, a pattern of a pixel electrode, a pattern of an ohmic contact layer, a pattern of an active layer, and a pattern of source-drain electrodes formed on the base substrate. The pattern of the pixel electrode is positioned between the pattern of the gate insulating layer and the pattern of the ohmic contact layer. The technical solutions of the present disclosure can reduce one mask process, thus lowering fabrication cost and improving product yield.

14 Claims, 5 Drawing Sheets

(51) Int. Cl.
*H01L 29/423* (2006.01)
*G02F 1/1362* (2006.01)
*G02F 1/1368* (2006.01)
*H01L 21/308* (2006.01)
*H01L 21/311* (2006.01)
*H01L 21/3213* (2006.01)
*H01L 27/12* (2006.01)

(52) U.S. Cl.
CPC ........ *H01L21/308* (2013.01); *H01L 21/31144* (2013.01); *H01L 21/32139* (2013.01); *H01L 27/1222* (2013.01); *H01L 27/1248* (2013.01); *H01L 27/1288* (2013.01); *H01L 29/423* (2013.01); *G02F 2001/136231* (2013.01)

(56) References Cited

U.S. PATENT DOCUMENTS

2014/0070240 A1* 3/2014 Zhou ................... H01L 29/458 257/88
2015/0162348 A1* 6/2015 Kohara ............... H01L 21/1288 257/43

FOREIGN PATENT DOCUMENTS

KR        20080049208 A      6/2008
KR          101294691 B1     8/2013

* cited by examiner

US 9,261,744 B2

ARRAY SUBSTRATE, FABRICATING METHOD THEREOF AND DISPLAY DEVICE

The application is a U.S. National Phase Entry of International Application No. PCT/CN2014/085203 filed on Aug. 26, 2014, designating the United States of America and claiming priority to Chinese Patent Application No. 201310476473.4 filed on Oct. 12, 2013. The present application claims priority to and the benefit of the above-identified applications and the above-identified applications are incorporated by reference herein in their entirety.

FIELD

The present disclosure relates to an array substrate, a fabricating method thereof and a display device.

BACKGROUND

Thin film transistor liquid crystal displays (TFT-LCD) have characteristics of small size, low power consumption, no radiation, which occupy a dominant position in the current market of flat panel displays. In the TFT-LCD industry, the TFT-LCD products of in-plane electric field driven mode having advanced super dimension switch (ADSDS) type thin film transistors (TFTs) can not only improve the picture quality of the TFT-LCD products, but also have advantages of high resolution, high transmittance, low power consumption, wide viewing angle, high aperture ratio, low chromatic aberration and no push mura, and the ADSDS type TFT-LCD products have become the mainstream products.

Gate driver on array substrate (GOA) technology integrats the TFT which forms gate drive circuit into the array substrate, thereby omitting the part of gate drive integrated circuit, and lowering cost of products through two aspects of material cost and processing steps.

Currently, in the TFT-LCD industry, on the one hand, the number of pixels per inch (PPI) is as high as possible in order to make the TFT-LCD products have better visual effects, and on the other hand, the GOA technology is adopted to lower the product cost. Therefore, when preparing the array substrates having high PPI and adopting the GOA technology, it is generally needs seven mask processes. However, cost and complexity of mask processes are high. The more times of applying the mask, the higher fabrication cost, and it is difficult to maintain the quality of products.

SUMMARY

In view of this, embodiments of the present invention provide an array substrate, a fabricating method thereof and a display device, which can reduce one mask process from the existing processes to lower fabrication cost and improve product yield.

Embodiments of the present invention provide an array substrate comprising a base substrate, and a pattern of a gate, a pattern of a gate insulating layer, a pattern of a pixel electrode, a pattern of an ohmic contact layer, a pattern of an active layer, and a pattern of source-drain electrodes sequentially formed on the base substrate, wherein the pattern of the pixel electrode is positioned between the pattern of the gate insulating layer and the pattern of the ohmic contact layer.

For example, the pattern of the gate insulating layer is positioned between the pattern of the gate and the pattern of the pixel electrode; the pattern of the ohmic contact layer is positioned between the pattern of the active layer and the pattern of the pixel electrode.

For example, the base substrate further comprises: a pattern of a passivation layer and a pattern of common electrodes sequentially formed over the pattern of the source-drain electrodes.

The embodiments of the present invention further provide a method for fabricating an array substrate. The array substrate may be the above-mentioned array substrate. The method comprises steps of: forming a pattern of a gate, a pattern of a gate insulating layer, a pattern of a pixel electrode, a pattern of an ohmic contact layer, a pattern of an active layer, and a pattern of source-drain electrodes sequentially on a base substrate, wherein the pattern of the pixel electrode and the pattern of the ohmic contact layer are formed by a single mask process.

For example, the pattern of the active layer and the pattern of the gate insulating layer are formed by the single mask process.

For example, the steps of forming the pattern of the gate, the pattern of the gate insulating layer, the pattern of the pixel electrode, the pattern of the ohmic contact layer, the pattern of the active layer and the pattern of the source-drain electrodes sequentially on the base substrate comprise steps of: forming the pattern of the gate on the base substrate by a first mask process; forming the pattern of the pixel electrode and the pattern of the ohmic contact layer by a second mask process; forming the pattern of the active layer and the pattern of the gate insulating layer by a third mask process; and forming the pattern of the source-drain electrodes by a fourth mask process.

For example, the method further comprises steps of: forming a pattern of a passivation layer by a fifth mask process; and forming a pattern of common electrodes by a sixth mask process.

For example, the second mask process comprises steps of: forming a pixel electrode film and an ohmic contact layer film sequentially on a structure obtained by the first mask process; applying a photoresist over the ohmic contact layer film, exposing the photoresist with a half tone mask and developing the photoresist to form a photoresist complete reserved region at a region corresponding to the source-drain electrodes, a photoresist partial reserved region at a region corresponding to the pixel electrode, and a photoresist complete removal region at rest areas; removing the pixel electrode film and the ohmic contact layer film in the photoresist complete removal region by a first etching process; removing the photoresist in the photoresist partial reserved region by an ashing process, and removing the ohmic contact layer film in the photoresist partial reserved region by a second etching process; and removing the photoresist in the photoresist complete reserved region by a stripping process.

For example, a gate insulating layer film is formed over the pattern of the gate between the first mask process and the second mask process; and the third mask process comprises steps of: forming an active layer film over the pattern of the ohmic contact layer after the second mask process; applying a photoresist over the active layer film, exposing the photoresist with a half exposure mask and developing the photoresist to form a photoresist complete reserved region at a region corresponding to the gate, a photoresist complete removal region at a region corresponding to a gate line lead, and a photoresist partial reserved region at rest areas; removing the active layer film and the gate insulating layer film in the photoresist complete removal region by a first etching process; removing the photoresist in the photoresist partial reserved region by an ashing process, and removing the active layer film in the photoresist partial reserved region by a second etching process; removing the photoresist in the photoresist complete reserved region by a stripping process.

The embodiments of the present invention further provide a display device comprising the above-mentioned array substrate.

The embodiments of the present invention provide an array substrate, a method for fabricating thereof and a display device, and the array substrate comprises a base substrate, and a pattern of a gate, a pattern of a gate insulating layer, a pattern of a pixel electrode, a pattern of an ohmic contact layer, a pattern of an active layer, and a pattern of source-drain electrodes sequentially formed on the base substrate, wherein the pattern of the pixel electrode is positioned between the pattern of the gate insulating layer and the pattern of the ohmic contact layer. The fabricating method of an array substrate comprises steps of: forming a pattern of a gate, a pattern of a gate insulating layer, a pattern of a pixel electrode, a pattern of an ohmic contact layer, a pattern of an active layer, and a pattern of source-drain electrodes on a base substrate, and the pattern of the pixel electrode and the pattern of the ohmic contact layer are formed by a single mask process. Thus the embodiments of the invention reduce one mask process from the existing seven mask processes to lower cost of production greatly and improve product yield, and form a channel without etching, thereby avoiding poor processing caused by the channel radically.

DETAILED DESCRIPTION

Figure 1A:
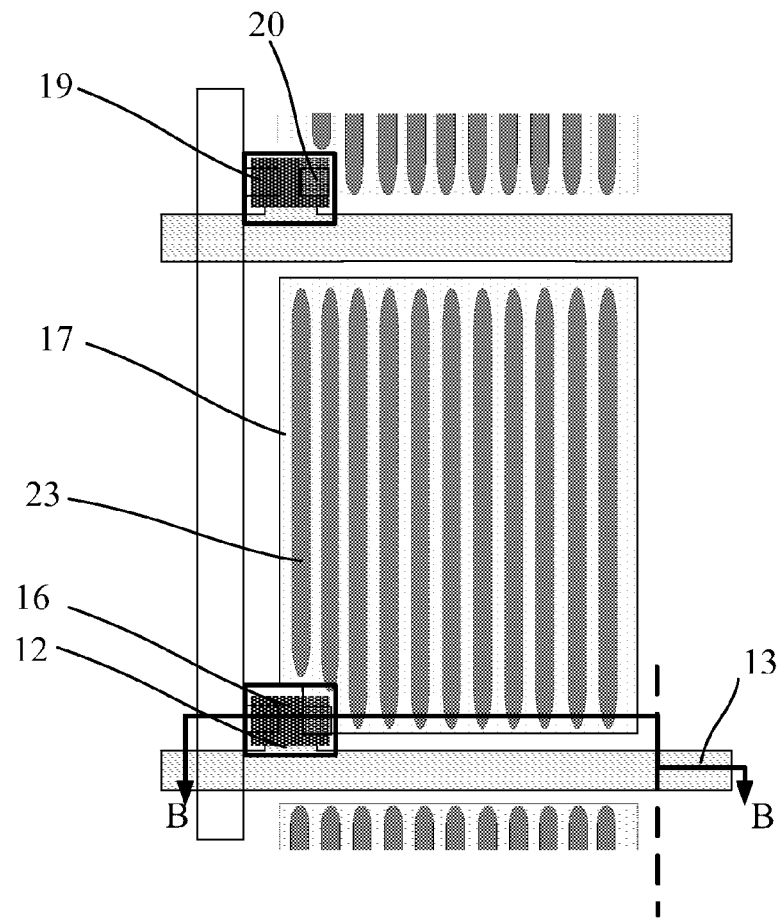
FIG. 1A is a schematic plan view illustrating a known array substrate of the inventor.

The technical solution of the embodiments of the present disclosure will be described clearly and fully in connection with the drawings of the embodiments of the present disclosure. It is obvious that the described embodiments are just a part but not all of the embodiments of the present disclosure. Based on the described embodiments of the present disclosure, those skilled in the art can obtain all other embodiment without any inventive work, which all fall into the scope of the claimed invention.

Unless otherwise defined, technical terms or scientific terms used herein shall have a common meaning known by those skilled in the art of the present disclosure. Words and expressions such as "first", "second" and the like used in the description and claims of the patent application of the present disclosure do not denote any sequence, quantity or importance, but distinguish different components. Likewise, words such as "a", "an" and the like do not denote quantitative restrictions, but denote the presence of at least one. Words such as "connected", "connecting" and the like are not restricted to physical or mechanical connections, but may include electrical connections, regardless of direct or indirect connections. Words such as "up", "below", "left", "right", etc., are only used to denote the relative positional relationship. Upon the absolute position of the described object changes, the relative positional relationship change correspondingly.

A fabricating method of an array substrate provided by the embodiments of the present invention is suitable for fabricating the array substrate having high PPI and employing GOA technology. The method comprises steps of: forming a pattern of a gate, a pattern of a gate insulating layer, a pattern of a pixel electrode, a pattern of an ohmic contact layer, a pattern of an active layer, and a pattern of source-drain electrodes on a base substrate, and the pattern of the pixel electrode and the pattern of the ohmic contact layer are formed by a single mask process.

Herein, the array substrate having high PPI means an array substrate with PPI higher than 300 PPI.

For example, the method further comprises a step of forming the pattern of the active layer and the pattern of the gate insulating layer by a single mask process.

For example, the steps of forming the pattern of the gate, the pattern of the gate insulating layer, the pattern of the pixel electrode, the pattern of the ohmic contact layer, the pattern of the active layer and the pattern of the source-drain electrodes on the base substrate comprise steps of: forming the pattern of the gate on the base substrate by a first mask process; forming the pattern of the pixel electrode and the pattern of the ohmic contact layer by a second mask process; forming the pattern of the active layer and the pattern of the gate insulating layer by a third mask process; and forming the pattern of the source-drain electrodes by a fourth mask process.

For example, the method further comprises steps of forming a pattern of a passivation layer by a fifth mask process; and forming a pattern of common electrodes by a sixth mask process.

For example, the second mask process comprises steps of forming a pixel electrode film and an ohmic contact layer film sequentially; applying a photoresist over the ohmic contact layer film, exposing the photoresist with a half tone mask and developing the photoresist to form a photoresist complete reserved region at an region corresponding to the source-drain electrodes, a photoresist partial reserved region at an region corresponding to the pixel electrode, and a photoresist complete removal region at rest regions; removing the pixel electrode film and the ohmic contact layer film in the photoresist complete removal region by a first etching process; removing the photoresist in the photoresist partial reserved region by an ashing process, and removing the ohmic contact layer film in the photoresist partial reserved region by a second etching process to form the pattern of the ohmic contact layer; and removing the photoresist at the photoresist complete reserved region by a stripping process to form the pattern of the pixel electrode.

For example, a gate insulating layer film is formed over the pattern of the gate between the first mask process and the second mask process. After the second mask process, the third mask process comprises steps of forming an active layer film over the pattern of the ohmic contact layer; applying a photoresist over the active layer film, exposing the photoresist with a half tone mask and developing the photoresist to form a photoresist complete reserved region at an region corresponding to the gate, a photoresist complete removal region at an region corresponding to the gate line, and a photoresist partial reserved region at rest regions; removing the active layer film and the gate insulating layer film in the photoresist complete removal region by a first etching process; removing the photoresist in the photoresist partial reserved region by an ashing process, and removing the active layer film in the photoresist partial reserved region by a second etching process; removing the photoresist in the photoresist complete reserved region by a stripping process.

An array substrate provided by the embodiments of the present invention comprises a base substrate, and a pattern of a gate, a pattern of a gate insulating layer, a pattern of a pixel electrode, a pattern of an ohmic contact layer, a pattern of an active layer, and a pattern of source-drain electrodes formed on the base substrate, wherein the pattern of the pixel electrode is positioned between the pattern of the gate insulating layer and the pattern of the ohmic contact layer.

It should be noted that the pattern of the gate described in the embodiments of the present invention generally comprises a gate and a gate line in the display region and the gate line lead in the non-display region formed by the same metal layer; the pattern of the source-drain electrodes generally comprises the source-drain electrodes and the data lines in the display region and the data line leads of the non-display region formed by the same metal layer; the pattern of the pixel electrode is generally a plate electrode formed in the display region; the pattern of the common electrodes is generally a strip electrode formed in the display region; the pattern of the gate insulating layer is an insulating layer covering the pattern of the gate, and the pattern of the passivation layer is an insulating layer covering the pattern of the pixel electrode, and the pattern of the gate insulating layer and the pattern of the passivation layer are generally transparent films covering the entire base substrate, only with via holes formed at a region corresponding to the gate line lead in the non-display region to transmit gate drive signals to the gate line; the pattern of the ohmic contact layer is generally formed at a region corresponding to the source-drain electrodes to reduce contact resistance. The patterns of respective layer formed on the array substrate described in the embodiments of the present invention may have other shapes or include other structures. For instance, the pattern of the pixel electrode may also be strip, and the pattern of the gate or the pattern of the source-drain electrodes may also include common electrode lines formed in the same layer, and the pattern of the source-drain electrodes or the pattern of the common electrodes may also include connection electrodes formed in the same layer, etc.

Technical solutions of the present invention will be further described in details as below in conjunction with drawings and specific embodiments. It should be noted that shapes or sizes or the like of structures illustrated in the drawings are the embodiments intended to explain the present invention, but not limit structures. The array substrate is divided into a display region and a surrounding lead region by a dotted line in the drawings, and the pattern in the display region and the surrounding lead region are formed simultaneously. In order to illustrate clearly and succinctly, the gate insulating layer, the ohmic contact layer and the passivation layer are not illustrated in the plan views, and cross-sectional lines of cross-sectional views are all illustrated as a direction along B-B line in FIG. 1A.

An ohmic contact layer is needed to reduce contact resistance generally for amorphous silicon thin film transistor array substrate, and the ohmic contact layer is positioned between an active layer and source-drain electrodes to reduce contact resistance. Specifically, as illustrated in FIG. 1A and FIG. 1B, the array substrate comprises a base substrate 11, a gate 12, a gate line and a gate line lead 13, a gate insulating layer 14, an ohmic contact layer 15, an active layer 16, a pixel electrode 17, a source 19, a drain 20, a first connection electrode 21, a passivation layer 22, a common electrode 23 and a second connection electrode 25.

Figure 1B:
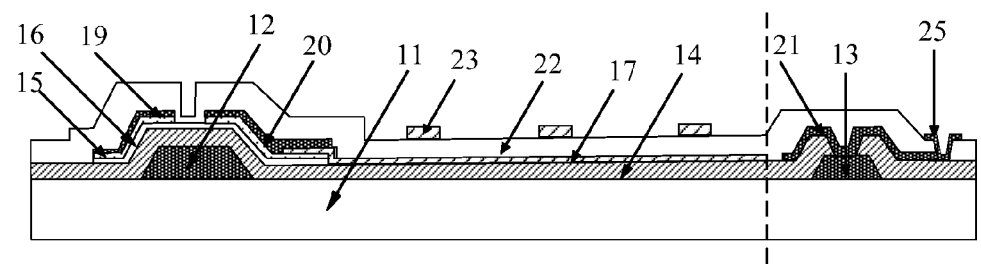
FIG. 1B is a cross-sectional view taken along line B-B in FIG. 1A.

The array substrate illustrated in FIG. 1A and FIG. 1B is fabricated by the method described below.

Figure 2A:
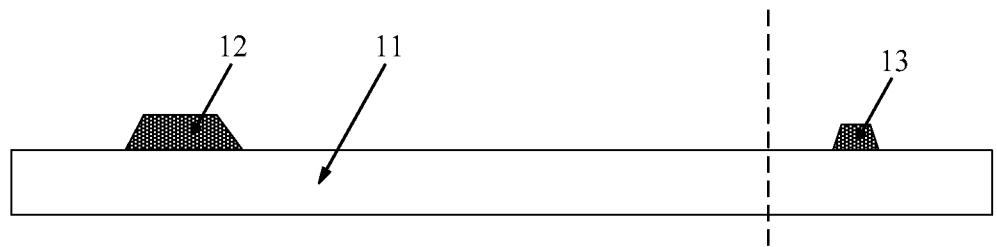
FIG. 2A is a schematic view illustrating a structure formed by a first mask process of the fabricating method of the array substrate shown in FIG. 1A and FIG. 1B.

FIG. 2A is a schematic view illustrating a structure formed by a first mask process of the fabricating method of the array substrate. As illustrated in FIG. 2A, a metal layer film is deposited on the array substrate 11, then the gate 12, the gate line and the gate line lead 13 are formed by a first mask process, wherein the gate and the gate line are in a display region and the gate line lead are in a surrounding lead region.

Figure 2B:
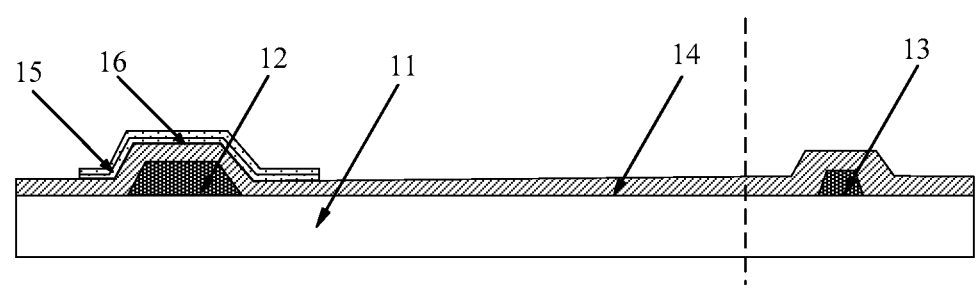
FIG. 2B is a schematic view illustrating a structure formed by a second mask process of the fabricating method of the array substrate shown in FIG. 1A and FIG. 1B.

FIG. 2B is a schematic view illustrating a structure formed by a second mask process of the fabricating method of the array substrate. As illustrated in FIG. 2B, the gate insulating layer film 14, the active layer film and the ohmic contact layer film are deposited sequentially from bottom to top on the structure formed by the first mask process, and the ohmic contact layer 15 and the active layer 16 are formed by the second mask process in the display region.

Figure 2C:
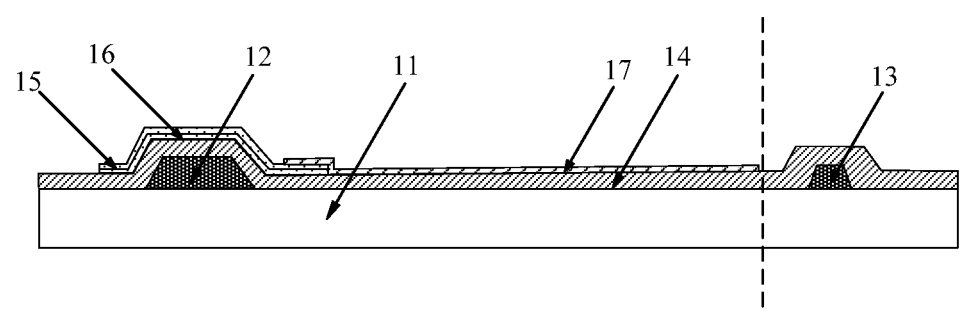
FIG. 2C is a schematic view illustrating a structure formed by a third mask process of the fabricating method of the array substrate shown in FIG. 1A and FIG. 1B.

FIG. 2C is a schematic view illustrating a structure formed by a third mask process of the fabricating method of the array substrate. As illustrated in FIG. 2C, a first transparent electrode film is deposited on the structure formed by the second mask process, and the pixel electrode 17 is formed by the third mask process in the display region.

Figure 2D:
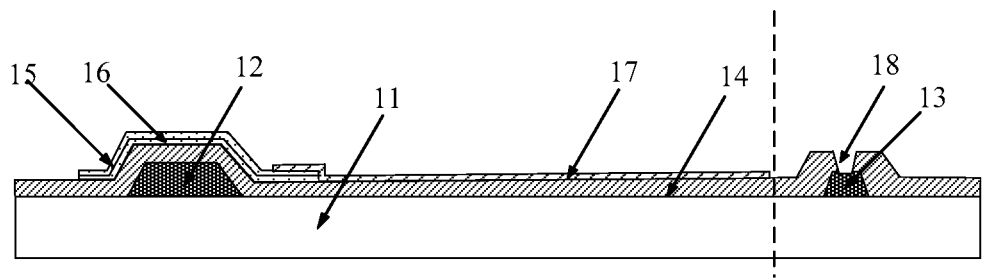
FIG. 2D is a schematic view illustrating a structure formed by a fourth mask process of the fabricating method of the array substrate shown in FIG. 1A and FIG. 1B.

FIG. 2D is a schematic view illustrating a structure formed by a fourth mask process of the fabricating method of the existing array substrate. As illustrated in FIG. 2D, a fourth mask process is performed directly without deposition of a film on the structure formed by the third mask process, and a gate insulating layer via hole 18 is formed on the gate insulating layer film 14 in the surrounding lead region.

Figure 2E:
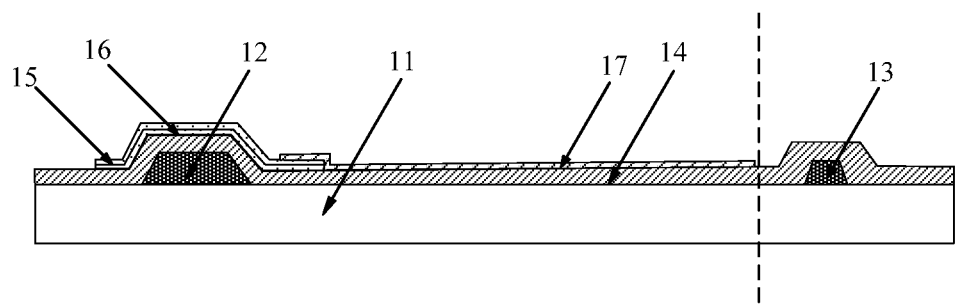
FIG. 2E is a schematic view illustrating a structure formed by a fifth mask process of the fabricating method of the array substrate shown in FIG. 1A and FIG. 1B.

FIG. 2E is a schematic view illustrating a structure formed by a fifth mask process of the fabricating method of the array substrate. As illustrated in FIG. 2E, on the structure formed by the fourth mask process, a metal layer film is deposited firstly, and the source 19 and the drain 20 and data lines (not illustrated in drawings) are formed by a fifth mask process in the display region, and a first connection electrode 21 is formed in the surrounding lead region, and the first connection electrode 21 is electrically connected to the gate line lead 13 by the via hole 18 in the gate insulating layer film 14.

Figure 2F:
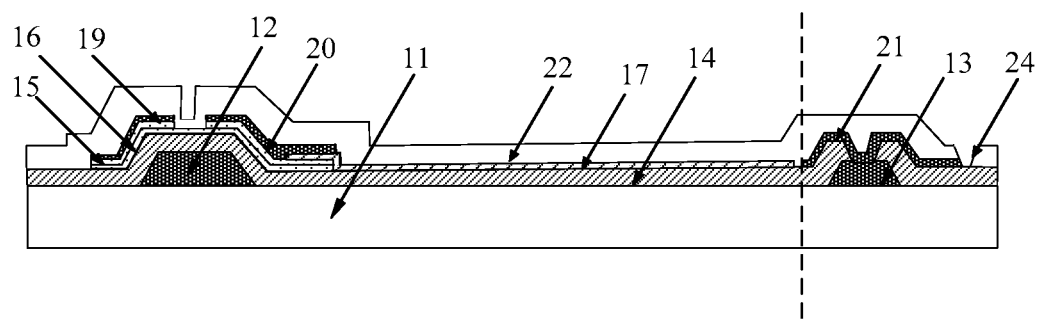
FIG. 2F is a schematic view illustrating a structure formed by a sixth mask process of the fabricating method of the array substrate shown in FIG. 1A and FIG. 1B.

FIG. 2F is a schematic view illustrating a structure of a passivation layer via hole formed by a sixth mask process of the fabricating method of the array substrate. As illustrated in FIG. 2F, on the structure formed by the fifth mask process, a passivation layer film 22 is deposited firstly, and a passivation layer via hole 24 in the passivation layer film is formed by a sixth mask process in the surrounding lead region. Then a second transparency electrode film is deposited, as illustrated in FIG. 1A, a common electrode 23 is formed in the display region and a second connection electrode 25 is formed in the surrounding lead region by a seventh mask process, and the second connection electrode 25 is electrically connected to the gate line lead 13 by the passivation layer via hole 24 of the passivation layer film and the first connection electrode 21.

The mask process comprises processes of applying a photoresist, exposing, developing, etching, and removing a photoresist. The above-mentioned patterns of layers may also be formed by other processes such as printing.

FIG. 3A to FIG. 3J are schematic views illustrating structures formed by respective steps of the fabricating method of an array substrate according to the embodiments of the present invention. As illustrated in FIG. 3A to FIG. 3J, the fabricating method of the array substrate according to the embodiments of the present invention comprises the following steps.

Figure 3A:
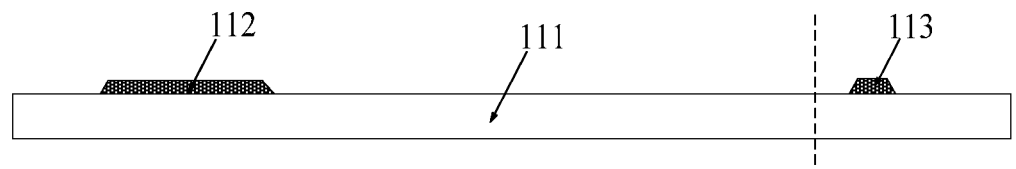
FIG. 3A is a schematic view illustrating a structure formed by a first mask process of the fabricating method of an array substrate according to an embodiment of the present invention.

As illustrated in FIG. 3A, a metal layer film is formed on a base substrate 111 firstly, then a gate 112 is formed by a first mask process, and also a gate line in a display region and a gate line lead 13 in a surrounding lead region are also formed simultaneously. The first mask process of the fabricating method of the array substrate according to embodiments of the present invention is the same as illustrated in FIG. 2A, and will not be repeated herein.

Figure 3B:
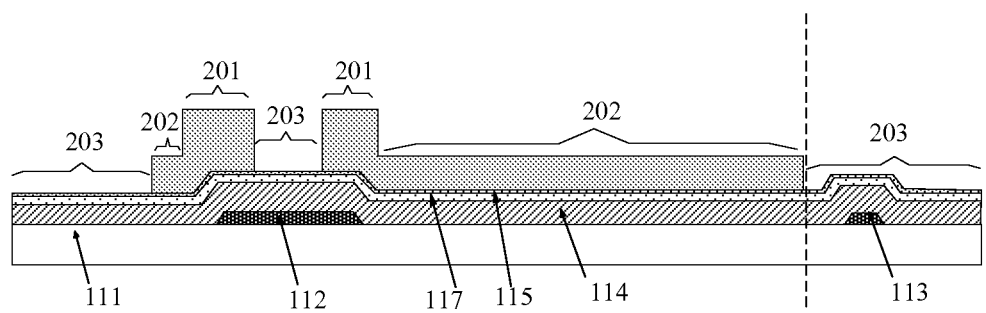
FIG. 3B is a schematic view illustrating a structure formed by a first step of a second mask process of the fabricating method of an array substrate according to an embodiment of the present invention.

As illustrated in FIG. 3B, on the structure formed by the first mask process, a gate insulating layer film 114, a first transparent electrode film and an ohmic contact layer film are deposited sequentially, wherein the gate insulating layer film 114 may be silicon nitride film or silicon oxide film, and the ohmic contact layer film may be n+ doped silicon oxide film, and the first transparent electrode film may be an indium tin oxide film. Then a pattern of an ohmic contact layer 115 and a pattern of a pixel electrode 117 are formed by a second mask process. For example, a photoresist is applied over the ohmic contact layer film, the photoresist is exposed with a half tone mask and developed to form a photoresist complete reserved region 201 at an region corresponding to the source-drain electrodes, a photoresist partial reserved region 202 at an region corresponding to the pixel electrode, and a photoresist complete removal region 203 at rest areas.

Figure 3C:
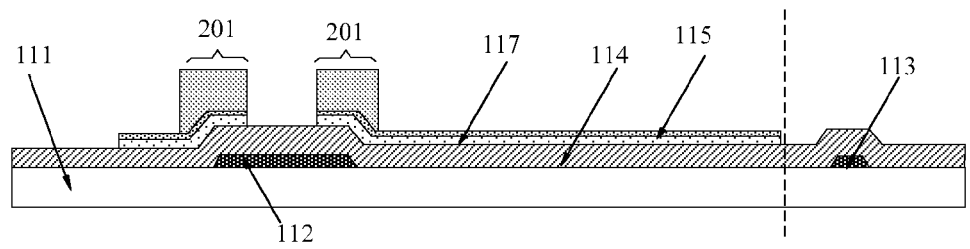
FIG. 3C is a schematic view illustrating a structure formed by a second step of a second mask process of the fabricating method of an array substrate according to an embodiment of the present invention.

As illustrated in FIG. 3C, the first transparent electrode film and the ohmic contact layer film below the photoresist complete removal region 203 are removed by an etching process; then the residual photoresist in the photoresist partial reserved region 202 is removed by an ashing process.

Figure 3D:
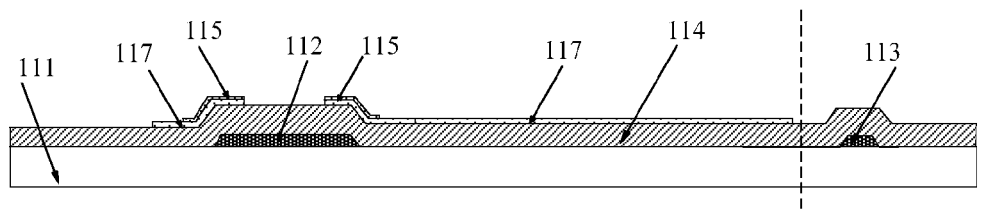
FIG. 3D is a schematic view illustrating a structure formed by a third step of a second mask process of the fabricating method of an array substrate according to an embodiment of the present invention.

As illustrated in FIG. 3D, the ohmic contact layer film in the photoresist partial reserved region 202 is removed by a second etching process to form a pattern of the ohmic contact layer 115; he photoresist in the photoresist complete reserved region 201 is removed by a stripping process to form a pattern of the pixel electrode 117.

Figure 3E:
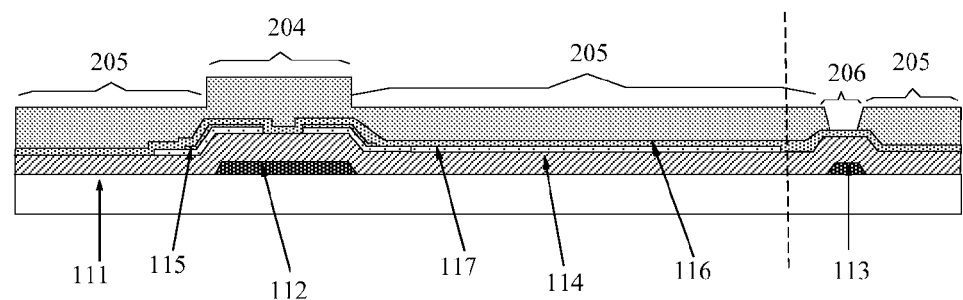
FIG. 3E is a schematic view illustrating a structure formed by a first step of a third mask process of the fabricating method of an array substrate according to an embodiment of the present invention.

As illustrated in FIG. 3E, on the structure formed by the second mask process, a pattern of an active layer 116 and a pattern of the gate insulating layer 114 are formed by a third mask process. For example, an active layer film is deposited firstly, and a photoresist is applied over the active layer film, the photoresist is exposed with a half tone mask and developed to form a photoresist complete reserved region 204 at an region corresponding to the gate 112, a photoresist complete removal region 206 at an region corresponding to the gate line lead 113, and a photoresist partial reserved region 205 at rest areas.

Figure 3F:
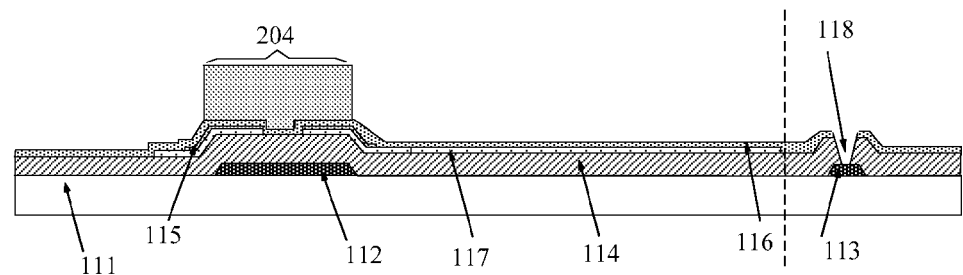
FIG. 3F is a schematic view illustrating a structure formed by a second step of a third mask process of the fabricating method of an array substrate according to an embodiment of the present invention.

As illustrated in FIG. 3F, the active layer film and the gate insulating layer film below the photoresist complete removal region 206 are removed by an etching process, and a gate insulating layer via hole 118 is formed over the gate line lead 113 in the surrounding lead region for transmitting gate drive signals to the gate line; then the residual photoresist in the photoresist partial reserved region 205 is removed by an ashing process.

Figure 3G:
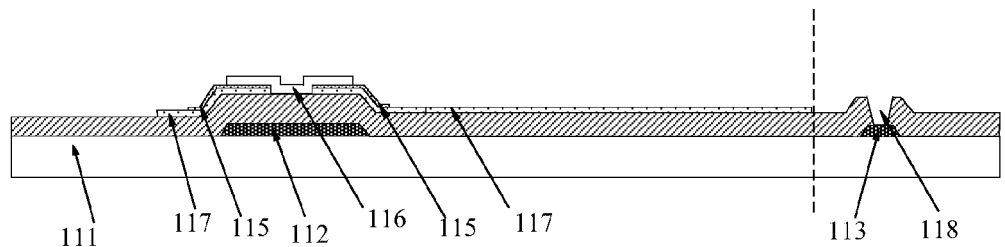
FIG. 3G is a schematic view illustrating a structure formed by a third step of a third mask process of the fabricating method of an array substrate according to an embodiment of the present invention.

As illustrated in FIG. 3G, the active layer film below the photoresist partial reserved region 205 is removed by an etching process. The photoresist in the photoresist complete reserved region 204 is removed by a stripping process to form a pattern of the active layer 116 in the display region.

Figure 3H:
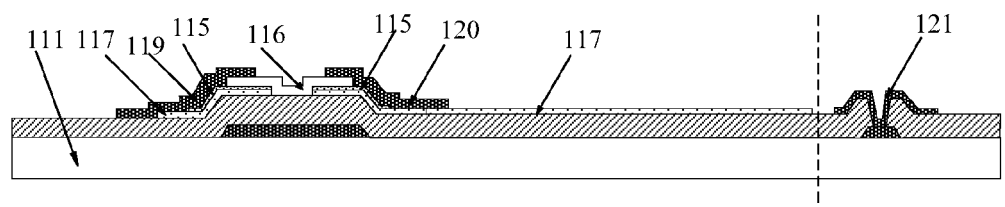
FIG. 3H is a schematic view illustrating a structure formed by a fourth mask process of the fabricating method of an array substrate according to an embodiment of the present invention.

As illustrated in FIG. 3H, on the structure formed by the third mask process, a metal layer is deposited firstly, then an source 119 and a drain 120 and data lines (not illustrated in drawings) in the display region are formed, and a first connection electrode 121 is formed in the surrounding lead region by one mask process.

Figure 3I:
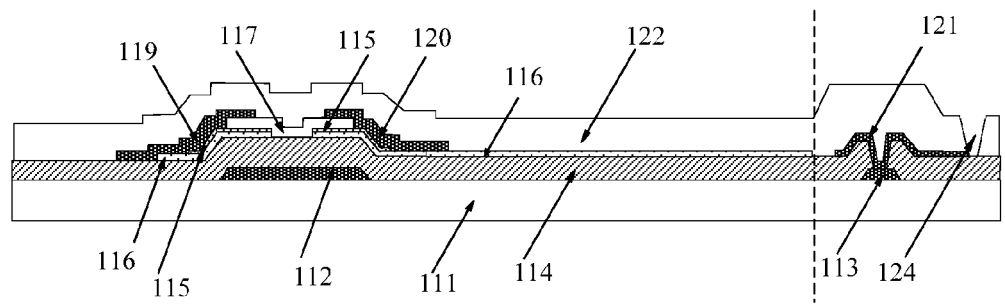
FIG. 3I is a schematic view illustrating a structure formed by a fifth mask process of the fabricating method of an array substrate according to an embodiment of the present invention.
Figure 3J:
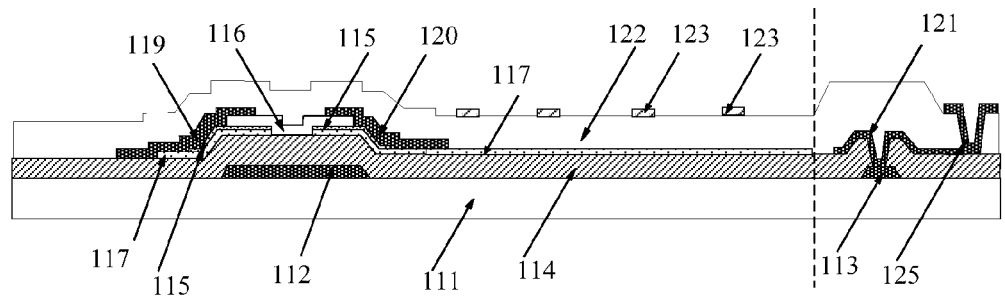
FIG. 3J is a schematic view illustrating an array substrate according to an embodiment of the present invention.

As illustrated in FIG. 3I, on the structure formed by the fourth mask process, a passivation layer film is deposited firstly, then a passivation layer via hole 124 is formed by a fifth mask process in the surrounding lead region. And a second transparent electrode film is deposited. By a sixth mask process, as illustrated in FIG. 3J, a common electrode 123 is formed in the display region, and a second connection electrode 125 is formed in the surrounding lead region, and the second connection electrode 125 is electrically connected to the gate line lead 113 by the passivation layer via hole 124 and the first connection electrode 121. The fifth mask process and the sixth mask process of the array substrate of the present invention are substantially the same as the sixth mask process and the seventh mask process in the method illustrated in FIG. 1A to FIG. 2F, respectively and will not be repeated herein.

As mentioned earlier, in the method illustrated in FIG. 1A to FIG. 2F, the pattern of the ohmic contact layer is conventionally positioned between the pattern of the active layer and the pattern of the source-drain electrode, and the pattern of the ohmic contact layer and the pattern of the active layer are usually formed together. And when forming the pattern of the source-drain electrode, the ohmic contact layer at the channel is etched off at the same time. In order not to influence switching performance of thin film transistors, the ohmic contact layer at the channel is usually need to be over etched, that is a part of the active layer below the ohmic contact layer is etched at the same time, which easily leads to poor processing of the thin film transistor channel. But in the embodiments of the present invention, the pattern of the ohmic contact layer 115 is positioned between the pattern of the pixel electrode 117 and the pattern of the active layer 116. In other words, the pattern of the pixel electrode 117 is positioned between the pattern of the gate insulating layer 114 and the pattern of the ohmic contact layer 115. In this way, in the fabricating method of the array substrate according to the embodiments of the present invention, the pattern of the ohmic contact layer 115 may be formed firstly, and then the pattern of the active layer 116 is formed, and the channel is formed without etching, thereby avoiding poor processing caused by the channel radically. In addition, since the pattern of the pixel electrode 117 and the pattern of the ohmic contact layer 115 are formed by a single mask process, and the pattern of the active layer 116 and the pattern of the gate insulating layer 114 are formed by a single mask process, one mask process can be reduced from the fabricating method of the array substrate illustrated in FIG. 1A to FIG. 2F so as to obtain an ADSDS type array substrate by six mask processes.

After forming the pattern of the active layer 116, a metal layer film is deposited, and the contact of the source-drain electrodes over the pattern of the active layer 116 is formed by a single mask process to form a new TFT structure. The positions of the pattern of the ohmic contact layer 115, the pattern of the active layer 116 and the pattern of the pixel electrode 117 in the embodiment of the present invention are different from those in the technical solution illustrated in FIG. 1A and FIG. 1B. The different positions may allow the above-mentioned array substrate to be formed by six mask processes, and a channel is formed without etching to ensure the product yield.

An array substrate is also provided by the embodiments of the present invention. FIG. 3J is a schematic view illustrating an array substrate of an embodiment of the present invention. As illustrated in FIG. 3J, the array substrate of the embodiment of the present invention comprises: a base substrate, and a pattern of a gate, a pattern of a gate insulating layer, a pattern of a pixel electrode, a pattern of an ohmic contact layer, a pattern of an active layer, and a pattern of source-drain electrodes sequentially formed on the base substrate. The pattern of the pixel electrode is positioned between the pattern of the gate insulating layer and the pattern of the ohmic contact layer, and the pattern of the gate insulating layer is positioned between the pattern of the gate and the pattern of the pixel electrode; the pattern of the active layer is positioned between the pattern of the ohmic contact layer and the pattern of the source-drain electrodes.

The array substrate provided by the embodiments of the present invention further comprises a pattern of a passivation layer and a pattern of common electrodes sequentially formed over the pattern of the source-drain electrodes.

Specifically, as illustrated in FIG. 3J, the array substrate provided by the embodiments of the present invention further comprises: a gate 112 and a gate line formed in the display region of the base substrate 111 and a pattern of the gate line lead 113 in the surrounding lead region; a pattern of the pixel electrode 117 and a pattern of the ohmic contact layer 115 sequentially formed on the gate 112 and the gate line 113, wherein the pixel electrode 117 may be a plate electrode or a strip electrode, and the pattern of the ohmic contact layer 115 is positioned over the pattern of the pixel electrode 117, and the ohmic contact layer 115 is only formed at an region corresponding to the source-drain electrodes, thereby a channel of the thin film transistor is formed; the pattern of the active layer 116 formed over the pattern of the ohmic contact layer 115, and a gate insulating layer via hole formed over the gate insulating layer 114 in the surrounding lead region, wherein the pattern of the ohmic contact layer 115 is formed before forming the pattern of the active layer 16, namely there is no need to form the channel of the thin film transistor by etching after forming the pattern of the active layer 116, which ensures the product yield; a source 119 and a drain 120 formed over the pattern of the active layer 116, and a pattern of the first connection electrode 121 formed in the surrounding lead region, wherein the drain 120 connects the pixel electrode 117 therebelow; the passivation layer 122 formed over the patterns of the source 119 and the drain 120 and the first connection electrode 121, wherein a passivation layer via hole is formed in the passivation layer 122 in the surrounding lead region; a pattern of the common electrodes 123 over the passivation layer 122; and a pattern of the second connection electrode 125 connected to the first connection electrode 121 by the passivation layer via hole in the surrounding lead region, wherein the first connection electrode 121 and the second connection electrode 125 are electrically connected to the gate line lead 113 by the passivation layer via hole and the gate insulating layer via hole to transmit gate drive signals to the gate line 113.

The positions of the pattern of the ohmic contact layer 115, the pattern of the active layer 116 and the pattern of the pixel electrode 117 in the embodiments of the present invention are different from those in the array substrate illustrated in FIG. 1A and FIG. 1B. The pattern of the pixel electrode 117 is positioned between the pattern of the gate insulating layer 114 and the pattern of the ohmic contact layer 115, and the pattern of the gate insulating layer 114 is positioned between the pattern of the gate 112 and the pattern of the pixel electrode 117; the pattern of the ohmic contact layer 115 is positioned between the pattern of the active layer 116 and the pattern of the pixel electrode 117. And such a structure constitutes a novel thin film transistor structure, which may allow the above-mentioned array substrate to be formed by six mask processes, and lower the production cost; and the channel is formed without etching to ensure the product yield.

Based on the above-mentioned array substrate, the embodiments of the present invention further provide a display device. The display device comprises an array base and a color filter substrate, wherein the array substrate comprises: a base substrate, and a pattern of a gate, a pattern of a gate insulating layer, a pattern of a pixel electrode, a pattern of an ohmic contact layer, a pattern of an active layer, and a pattern of source-drain electrodes sequentially formed on the base substrate. In the display device, the color filter may be also integrated in an array substrate, that is the display device may comprise an array substrate and a counter substrate.

It should be noted that the display device provided by the embodiment of the present invention may be any product or component having a display function, such as a liquid crystal panel, a mobile phone, a tablet PC, a television, a display, a laptop, a digital photo frame and a navigator electronic paper, etc.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable the skilled in the art to best utilize the invention in various embodiments and with various modifications as are suited to the particular use contemplated. It is intended that the scope of the invention be defined by the claims appended hereto.

The present application claims the benefits of Chinese patent application No. 201310476473.4 filed on Oct. 12, 2013, which is incorporated herein by reference in its entirety.

What is claimed is:

1. An array substrate, comprising a base substrate, and a pattern of a gate, a pattern of a gate insulating layer, a pattern of a pixel electrode, a pattern of an ohmic contact layer, a pattern of an active layer, and a pattern of source-drain electrodes sequentially formed on the base substrate,
   wherein the pattern of the pixel electrode is positioned between the pattern of the gate insulating layer and the pattern of the ohmic contact layer.

2. The array substrate according to claim 1, wherein the pattern of the gate insulating layer is positioned between the pattern of the gate and the pattern of the pixel electrode;
   the pattern of the ohmic contact layer is positioned between the pattern of the active layer and the pattern of the pixel electrode.

3. The array substrate according to claim 1, further comprising: a pattern of a passivation layer and a pattern of common electrodes which are sequentially formed over the pattern of the source-drain electrodes.

4. A fabricating method of an array substrate comprising steps of: forming a pattern of a gate, a pattern of a gate insulating layer, a pattern of a pixel electrode, a pattern of an ohmic contact layer, a pattern of an active layer, and a pattern of source-drain electrodes sequentially on a base substrate, wherein the pattern of the pixel electrode and the pattern of the ohmic contact layer are formed by a single mask process.

5. The method according to claim 4, wherein the pattern of the active layer and the pattern of the gate insulating layer are formed by the single mask process.

6. The method according to claim 5, wherein the steps of forming the pattern of the gate, the pattern of the gate insulating layer, the pattern of the pixel electrode, the pattern of the ohmic contact layer, the pattern of the active layer and the pattern of the source-drain electrodes sequentially on the base substrate comprising steps of:
   forming the pattern of the gate on the base substrate by a first mask process;
   forming the pattern of the pixel electrode and the pattern of the ohmic contact layer by a second mask process;
   forming the pattern of the active layer and the pattern of the gate insulating layer by a third mask process; and
   forming the pattern of the source-drain electrodes by a fourth mask process.

7. The method according to claim 6, further comprising steps of:
   forming a pattern of a passivation layer by a fifth mask process; and
   forming a pattern of common electrodes by a sixth mask process.

8. The method according to claim 6, wherein the second mask process comprising steps of:
   forming a pixel electrode film and an ohmic contact layer film sequentially on a structure obtained by the first mask process;
   applying a photoresist over the ohmic contact layer film, exposing the photoresist with a half tone mask and developing the photoresist to form a photoresist complete reserved region at an region corresponding to the source-drain electrodes, a photoresist partial reserved region at an region corresponding to the pixel electrode, and a photoresist complete removal region at rest regions;
   removing the pixel electrode film and the ohmic contact layer film in the photoresist complete removal region by a first etching process;
   removing the photoresist in the photoresist partial reserved region by an ashing process, and removing the ohmic contact layer film in the photoresist partial reserved region by a second etching process; and
   removing the photoresist at the photoresist complete reserved region by a stripping process.

9. The method according to claim 6, wherein,
   a gate insulating layer film is formed over the pattern of the gate between the first mask process and the second mask process; and
   the third mask process comprising steps of:
   forming an active layer film over the pattern of the ohmic contact layer after the second mask process;
   applying a photoresist over the active layer film, exposing the photoresist with a half tone mask and developing the photoresist to form a photoresist complete reserved region at an region corresponding to the gate, a photoresist complete removal region at an region corresponding to a gate line, and a photoresist partial reserved region at rest regions;
   removing the active layer film and the gate insulating layer film in the photoresist complete removal region by a first etching process;
   removing the photoresist in the photoresist partial reserved region by an ashing process, and removing the active layer film in the photoresist partial reserved region by a second etching process; and
   removing the photoresist in the photoresist complete reserved region by a stripping process.

10. A display device comprising
   an array substrate, comprising a base substrate, and a pattern of a gate, a pattern of a gate insulating layer, a pattern of a pixel electrode, a pattern of an ohmic contact layer, a pattern of an active layer, and a pattern of source-drain electrodes sequentially formed on the base substrate,
   wherein the pattern of the pixel electrode is positioned between the pattern of the gate insulation layer and the pattern of the ohmic contact layer.

11. The display device according to claim 10, wherein the pattern of the gate insulating layer is positioned between the pattern of the gate and the pattern of the pixel electrode;
   the pattern of the ohmic contact layer is positioned between the pattern of the active layer and the pattern of the pixel electrode.

12. The display device according to claim 10, further comprising: a pattern of a passivation layer and a pattern of common electrodes which are sequentially formed over the pattern of the source-drain electrodes.

13. The display device according to claim 11, further comprising: a pattern of a passivation layer and a pattern of common electrodes which are sequentially formed over the pattern of the source-drain electrodes.

14. The array substrate according to claim 2, further comprising: a pattern of a passivation layer and a pattern of common electrodes which are sequentially formed over the pattern of the source-drain electrodes.

* * * * *